US011264986B1

(12) United States Patent
Cholasta et al.

(10) Patent No.: US 11,264,986 B1
(45) Date of Patent: Mar. 1, 2022

(54) CAPACITIVE TOUCH SENSING WITH HIGH SAFETY INTEGRITY

(71) Applicant: NXP USA, Inc., Austin, TX (US)

(72) Inventors: Petr Cholasta, Hutisko-Solanec (CZ); Michael Rohleder, Unterschleissheim (DE); Anita Eveline Maliverney, Waldenbuch (DE); Yiling Zhang, Munich (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/095,081

(22) Filed: Nov. 11, 2020

(51) Int. Cl.
  *G06F 3/044* (2006.01)
  *H03K 17/96* (2006.01)

(52) U.S. Cl.
  CPC ........... *H03K 17/962* (2013.01); *G06F 3/044* (2013.01); *H03K 2217/960755* (2013.01)

(58) Field of Classification Search
  CPC ........ H03K 17/962; G06F 3/041; G06F 3/044
  USPC ....................................................... 307/125
  See application file for complete search history.

(56) References Cited

U.S. PATENT DOCUMENTS

| 8,937,611 | B2* | 1/2015 | Yilmaz | H03K 17/9622 |
| | | | | 345/174 |
| 9,559,689 | B2 | 1/2017 | Adkins et al. | |
| 9,948,297 | B2* | 4/2018 | Bruwer | G06F 3/0445 |
| 2017/0052633 | A1 | 2/2017 | Kurobe et al. | |
| 2017/0097699 | A1 | 4/2017 | Mahdi | |

OTHER PUBLICATIONS

Atmel, "Atmel-42679C-SAM-C20-QTouch-Safety-Library_User Guide-07/2016," Jul. 2016; 117 pages.
Leonhardt et al., "Unobtrusive Vital Sign Monitoring in Automotive Environments—A Review," Sensors 2018, Sep. 13, 2018; 38 pages.
Olberding et al., "A Cuttable Multi-touch Sensor," UIST'13, Oct. 8-11, 2013; 10 pages.
Rayes et al., "Implementation of capacitive touch sensing safety system for electric adjustable beds," International Journal of Sensors and Sensor Networks, vol. 2, No. 5, 2014, pp. 42-47; 6 pages.

* cited by examiner

*Primary Examiner* — Hai L Nguyen

(57) ABSTRACT

A method for capacitive touch sensing with high safety integrity includes measuring at least one of a first mutual-capacitance of an electrode pair comprising two of a first electrode, a second electrode and a third electrode, and a self-capacitance between the third electrode and a body biased to a fixed voltage. A contact of the body to a dielectric overlaying each of the first electrode, the second electrode and the third electrode is detected by comparing at least one of the first mutual-capacitance of the electrode pair to a first reference range, and the self-capacitance to a second reference range.

10 Claims, 9 Drawing Sheets

| Mode | Capacitance Measurement | Areas Measured | GPIO1 | GPIO2 | GPIO3 | GPIO4 |
|---|---|---|---|---|---|---|
| Mode 1 | Self-cap | TP3 to GND | LL or Hi-Z | LL or Hi-Z | Tx, Rx | Tx, Hi-Z |
| Mode 2A | Mutual-cap | TP3 to TP1 | Rx | LL or Hi-Z | Tx | Tx |
| Mode 2B | Mutual-cap | TP3 to TP2 | LL or Hi-Z | Rx | Tx | Tx |
| Mode 2C | Mutual-cap | TP3 to TP1&TP2 | Rx | Rx | Tx | Tx |
| Mode 3A | Mutual-cap | TP1 to TP2 | Tx | Rx | LL or Hi-Z | LL or Hi-Z |
| Mode 3B | Mutual-cap | TP2 to TP1 | Rx | Tx | LL or Hi-Z | LL or Hi-Z |

CAPACITIVE TOUCH SENSING WITH HIGH SAFETY INTEGRITY

FIELD

This disclosure relates generally to Human Machine Interfaces (HMI), and more specifically to a capacitive touch interface with high safety integrity.

BACKGROUND

HMIs with finger touch detect capability (e.g., to activate a button or a keyboard), are gaining in popularity. In particular, capacitive touch sensing methods have emerged as a preferred implementation for this capability, mostly due to its cost benefits and possible stylish implementations. The usage of such an HMI for a safety critical function requires a specific sensor that is capable of detecting a malfunction to avoid hazards caused by incorrectly detecting human interaction, or lack thereof.

With regards to the automotive industry, examples of related safety functions include a car parking brake button or the car cruise speed control. Such HMIs are classified by a higher safety integrity level (e.g., ASIL-B, ASIL-C or even ASIL-D), as defined by the International Organization for Standardization (ISO) 26262-2018 standard. Traditional capacitive touch sensing methods do not provide for the safety integrity requirements of these automotive functions, thus requiring more bulky and costly alternatives.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 11 is a tabular view of operations associated with an example embodiment of FIG. 4

DETAILED DESCRIPTION

Various embodiments described herein provide for a capacitive touch sensing system with redundant touch sensing methods from a single sensor while concurrently verifying the integrity of the sensing system including each electrode and related wiring. Accordingly, a low cost and robust capacitive sensing system is provided to meet higher Automotive Safety Integrity Level (ASIL) requirements (e.g., ASIL-B, ASIL-C and ASIL-D) for automotive applications. Additionally, the sensing system taught by this disclosure is useable in other applications requiring high integrity, including but not limited to home appliances, smart home devices (e.g., thermostats or chargers), devices conforming to the International Electrotechnical Commission (IEC) 60730 standard and also many industrial devices. It may also be used in medical devices having equivalent needs. The touch sensing system has enhanced availability because it continues to operate in a degraded mode, without functional safety, when a sensing electrode or wiring is compromised.

Figure 1:
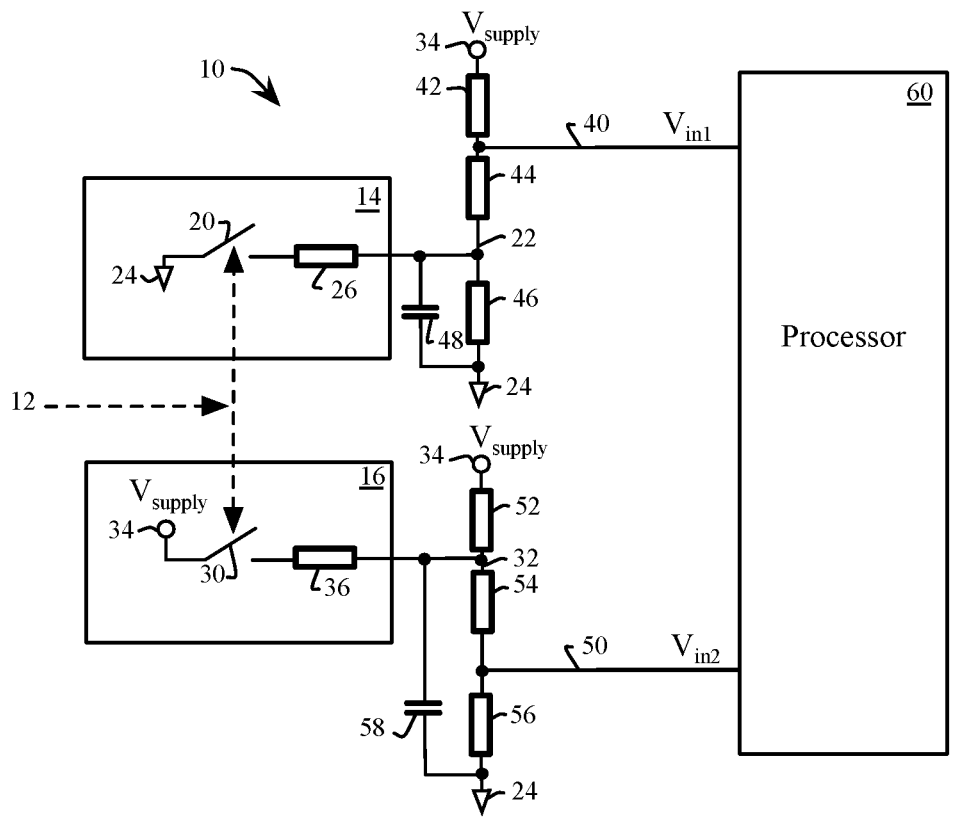
FIG. 1 is a schematic view of an HMI embodiment based on redundant mechanical switches.
Figure 2:
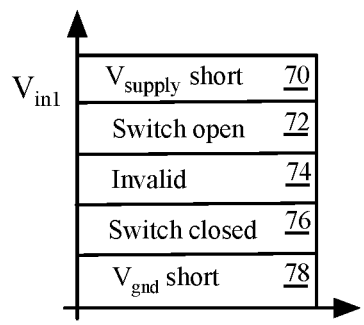
FIG. 2 is a graphical view of the sensed $V_{in}1$ voltage levels of the embodiment of FIG. 1.
Figure 3:
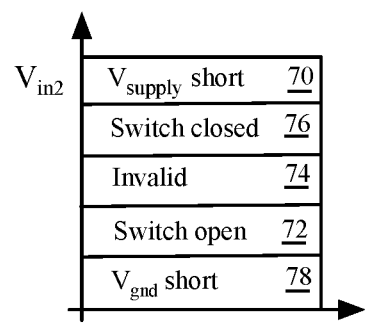
FIG. 3 is a graphical view of the sensed $V_{in}2$ voltage levels of the embodiment of FIG. 1.

FIG. 1 shows an embodiment 10 of an HMI system implemented with redundant mechanical switches 14 and 16, controlled by a mechanical contact 12. The switch 14 includes a contact 20 connected between a switch output 22 and a ground 24. The switch 14 further includes an internal resistance 26 between the contact 20 and the switch output 22. The switch 16 includes a contact 30 connected between a switch output 32 and a power supply 34. The switch 16 further includes an internal resistance 36 between the contact 30 and the switch output 32. A first input voltage 40 (Vin1) is formed by a resistor divider formed by resistors 42, 44 and 46 between the voltage supply 34 and ground 24. A dampening capacitor 48 is shown between the switch output 22 and the ground 24. A second input voltage 50 (Vin2) is formed by a resistor divider formed by resistors 52, 54 and 56 between the voltage supply 34 and ground 24. A dampening capacitance 58 is shown between the switch output 32 and the ground 24. The first input voltage 40 and the second input voltage 50 provide redundant inputs to a processor 60 to determine one of five conditions of the mechanical contact 12, as further described in FIG. 2 and FIG. 3.

Higher safety integrity levels are achieved by implementing redundancy with two mechanical switches and with failure diagnosis. Specifically, one or both of the input voltages 40 and 50 are verified against voltage thresholds to determine a short 70 to the power supply 34, a closed switch 72 (e.g., the mechanical contact 12), an invalid condition 74 from a resistive short for example, an opened switch 76 (e.g., the mechanical contact 12), or a short 78 to the ground 24. Implementation of the invalid "out of range" condition 74, the short 70 to the power supply 34 and the short 78 to the ground 24 are based on requirements of the ISO 26262 standard. The redundant implementation of the switches 14 and 16 is also based on requirements of the ISO 26262 standard for a higher integrity level. The embodiment 10 of FIG. 1 is difficult to design and operate with sufficient margin for the five states shown in FIG. 2 and FIG. 3 in light of power supply 34 voltage variations, variations of the internal resistors 26 and 36 and lifetime aging effects of the components in FIG. 1. The mechanical switches 14 and 16 are also bulky, expensive and prone to failure due to contamination from dust and the like.

Figure 4:
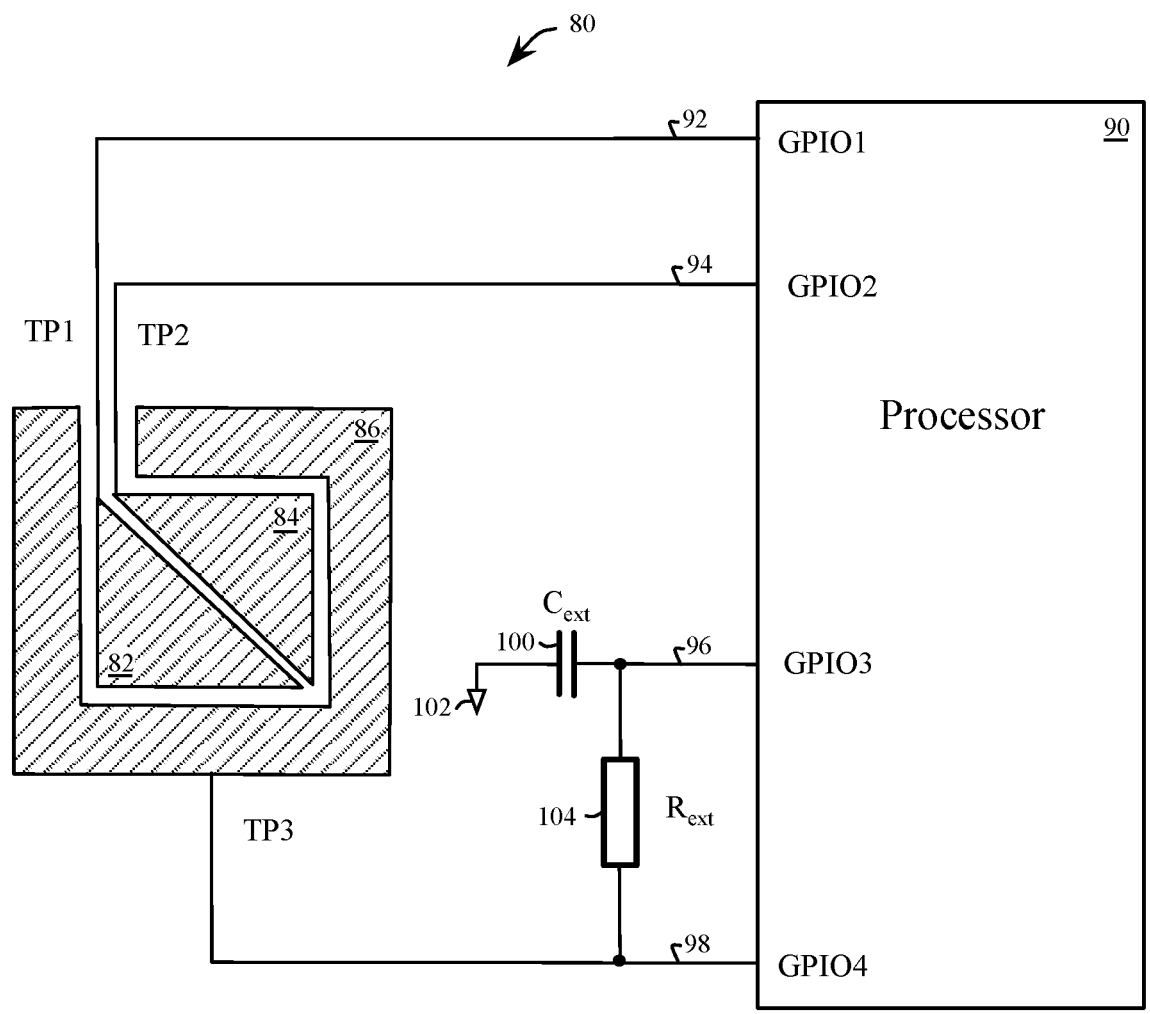
FIG. 4 is a schematic view of a system for capacitive touch sensing with high safety integrity, in accordance with an example embodiment of the present disclosure.

FIG. 4 introduces an example embodiment 80 of a capacitive touch sensing system, (also referred to as a "safety knob"), with improves upon the embodiment 10 of FIG. 1 with higher levels of safety integrity, less bulk and lower cost in addition to other benefits. The embodiment 80 performs a mutual-capacitance measurement with electrodes 82 and 84 to detect a finger touch or other contact to the capacitive sensors. Additionally, the embodiment 80 performs a self-capacitance measurement with the electrode 86 to provide a method for detecting a contact (as well as a proximity detection) to the capacitive sensors. A respective mutual capacitance is also made between each pair of electrodes chosen from the three electrodes 82, 84 and 86 to verify the integrity of each electrode and related wiring thereto, thus satisfying the requirements of the ISO26262 standard for higher safety integrity levels. The electrodes 82, 84 and 86 are also referred to as Touch Pads (TP) TP1, TP2 and TP3 respectively.

The embodiment 80 includes a processor 90 with four General Purpose Input Output (GPIO) ports GPIO1 92, GPIO2 94, GPIO3 96 and GPIO4 98. In various embodiments, the processor 90 is replaced with a microcontroller, a state machine and the like, without loss of generality. In one embodiment, the GPIO ports of the processor 90 are driven with a combination of low states (LL), high states (HH) or a high-impedance state (Hi-Z). In a transmit mode (Tx), the processor 90 drives the respective GPIO with a high or low state. In a receive mode (Rx), the respective GPIO is connected to an Analog to Digital Converter (ADC). The GPIO3 96 is connected to an external capacitor 100 (Cext) connected to a ground 102. In other embodiments, the ground 102 is replaced with a fixed reference value with the various signals of the processor 90 are referenced. An external resistor 104 (Rext) is connected between GPIO3 96 and GPIO4 98.

In one example embodiment, a self-capacitance measurement is performed between TP3 86 and a body (e.g., a human finger grounded to a vehicle's ground potential) across an interposed dielectric overlaying the electrodes 82, 84 and 86. In one example embodiment, the self-capacitance measurement is performed by discharging GPIO4 98 to ground 102, charging the external capacitor 100 to the power supply voltage by driving GPIO3 96 to HH, charge sharing between TP3 86 and the body with the external capacitor 100 through the external resistor 104, then measuring the GPIO3 96 voltage (or alternatively GPIO4 98) with an ADC in the processor 90. In another embodiment, self-capacitance measurement is performed by charging GPIO4 98 to HH, discharging the external capacitor 100 to ground by driving GPIO3 96 to LL, charge sharing between TP3 86 and the body with the external capacitor 100 through the external resistor 104, then measuring the GPIO3 96 voltage (or alternatively GPIO4 98) with an ADC in the processor 90. When a body contacts the dielectric overlaying TP3 86, the body capacitance will be added in series with the capacitance of TP3 86, thus changing the resulting voltage on GPIO3 96 after charge sharing through the external resistor 104. This change in voltage is compared to a reference range within the processor 90 to detect a finger or body touch to the capacitive touch sensor embodiment 80.

In one example embodiment, a mutual-capacitance measurement is performed between TP1 82 and TP2 84 to perform a redundant method of detecting the body contact to the overlaying dielectric. Specifically, the GPIO1 92 transmits a high slew rate signal (e.g., a pulse or square wave), and the resulting charge transfer between TP1 82 and TP2 84 is measured as a voltage on GPIO2 94. When a body contacts the overlaying dielectric, a body capacitance is connected in parallel with the mutual-capacitance of TP1 82 to TP2 84, thus lowering the combined capacitance and consequently changing the amount of charge transferred between the GPIO1 92 output and the GPIO2 94 input. The change in voltage measured at GPIO2 94 due to the body contact, is converted with an ADC of the processor 90 to a range to determine that a body contact was made to the overlaying dielectric. The equivalent is true when the GPIO2 acts as transmitter, and the GPIO1 is used to measure the voltage.

It should be appreciated that in other embodiments, GPIO1 92 and GPIO2 94 are interchanged for performing the mutual-capacitance measurement between TP1 82 and TP2 84. Accordingly, a finger touch or other contact to the overlaying dielectric is detected by both the self-capacitance measurement of TP3 86 and the mutual-capacitance measurement between TP1 82 and TP2 84.

Similar to the method used for measuring the mutual-capacitance between TP1 82 and TP2 84, the mutual-capacitance between TP3 86 and TP1 82 is measured by transmitting a high slew rate signal on GPIO3 96 and GPIO4 98 and measuring the transferred charge as a voltage at GPIO1 92. Similarly, the mutual-capacitance between TP3 86 and TP2 84 is measured by transmitting a high slew rate signal on GPIO3 96 and GPIO4 98 and measuring the transferred charge as a voltage at GPIO2 94. The mutual-capacitance measurements between each pair chosen from TP1 82, TP2 84 and TP3 86 is used to determine fault conditions on one of the three electrodes 82, 84, and 86 and related wiring thereto in accordance with the ISO26262 standard. In some embodiments, it the external capacitor 100 and external resistor 104 are integrated into the processor 90. If either method of finger touch detection fails, the touch sensor embodiment 80 continues to detect the finger touch in a "degraded" mode, such that a finger touch is detected without the safety mechanisms defined in the IS020626 standard.

Figure 5:
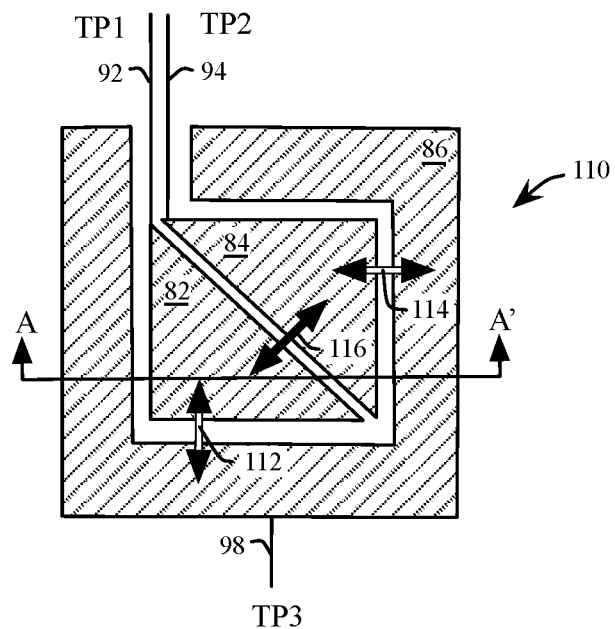
FIG. 5 is a top plan view of an example embodiment of a capacitive touch sensor.
Figure 6:
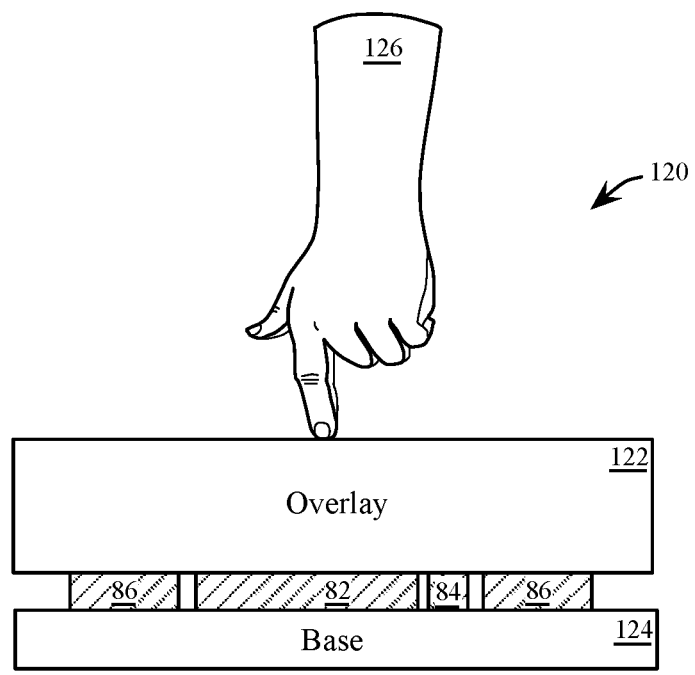
FIG. 6 is a cross-sectional view of FIG. 5 taken along A-A', showing a capacitive touch sensor showing a contact thereon.

Turning now to FIG. 5 and FIG. 6, the construction of respective example embodiment 110 and 120 is described. In FIG. 5, the example embodiment 110 of a capacitive touch sensor is the same as used in FIG. 4 with TP1 82 and TP2 84 having a triangular shape. The respective mutual-capacitance of TP3 86 to TP1 82, TP3 86 to TP2 84, and TP1 82 to TP2 84 are represented by arrows 112, 114 and 116 respectively. FIG. 6 shows a cross-sectional view of FIG. 5 taken along A-A'. In FIG. 6, the TP1 82, TP2 84 and TP3 86 electrodes are interposed between a non-conductive (e.g., dielectric) overlay 122 and a non-conductive base 124. In one example embodiment, the base 124 is made from a plastic foil or Printed Circuit Board (PCB) insulating material. The overlay 122 protects the TP1 82, TP2 84 and TP3 86 electrodes from contamination such as dust, water drops, hand creams, and the like, while serving as a dielectric between the electrodes and a body 126 (e.g., a human finger). In one example embodiment, the spacing between TP1 82, TP2 84 and TP3 86 is hundreds of micrometers.

Figure 7:
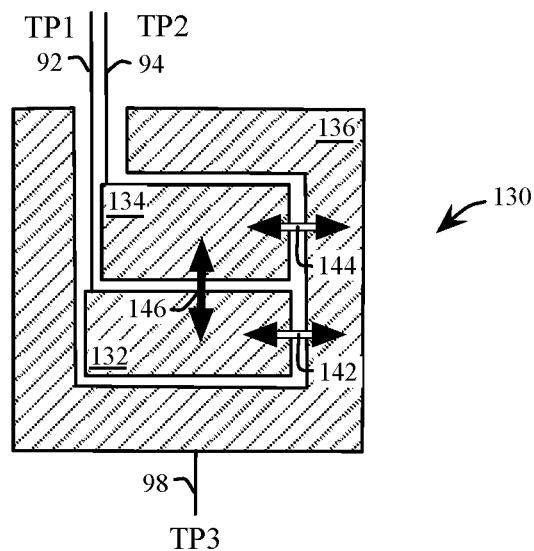
FIG. 7 is a top plan view of an example embodiment of a capacitive touch sensor.
Figure 8:
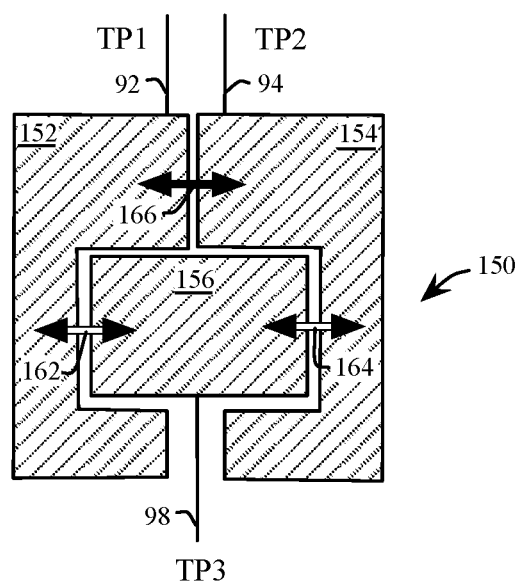
FIG. 8 is a top plan view of an example embodiment of a capacitive touch sensor.

FIG. 7 through FIG. 10 shows additional embodiments of the capacitive touch sensor 110 of FIG. 5. In FIG. 7, TP1 132 and TP2 134 of the capacitive touch sensor 130 have rectilinear shapes surrounded by TP3 136. TP3 136 is the same shape as TP3 86 of FIG. 5. The respective mutual-capacitance of TP3 136 to TP1 132, TP3 136 to TP2 134, and TP1 132 to TP2 134 are represented by arrows 142, 144 and 146 respectively. In FIG. 8, TP1 152 and TP2 154 of the capacitive touch sensor 150 have rectilinear shapes surrounding TP3 156. The respective mutual-capacitance of TP3 156 to TP1 152, TP3 156 to TP2 154, and TP1 152 to TP2 154 are represented by arrows 162, 164 and 166 respectively.

Figure 9:
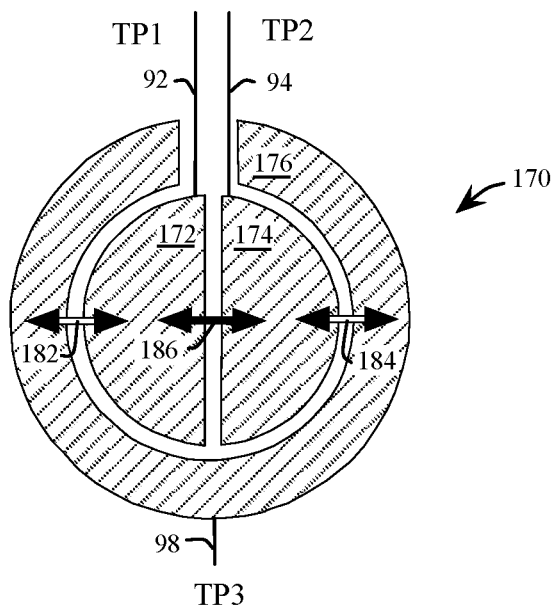
FIG. 9 is a top plan view of an example embodiment of a capacitive touch sensor.
Figure 10:
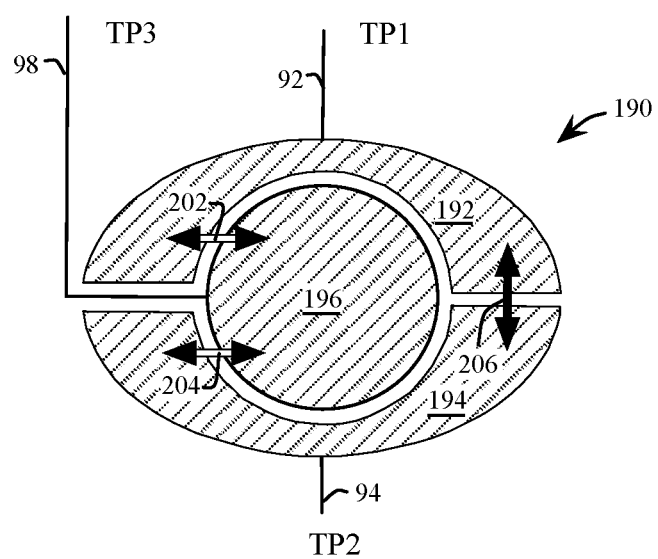
FIG. 10 is a top plan view of an example embodiment of a capacitive touch sensor.

In FIG. 9, TP1 172 and TP2 174 of the capacitive touch sensor 170 have semicircular shapes and are surrounded by TP3 176. The respective mutual-capacitance of TP3 176 to TP1 172, TP3 176 to TP2 174, and TP1 172 to TP2 174 are represented by arrows 182, 184 and 186 respectively. In FIG. 10, TP1 192 and TP2 194 of the capacitive touch sensor 190 have curved shapes and surround TP3 196, which has a circular shape. The respective mutual-capacitance of TP3 196 to TP1 192, TP3 196 to TP2 194, and TP1 192 to TP2 194 are represented by arrows 202, 204 and 206 respectively.

The example embodiments shall indicate that there are many possible shapes for a capacitive touch sensor that are all fulfilling the requirements of redundant measurement and verifiable function as is required by the ISO26262 standard. As such, these example embodiments are not representing a complete set of the possible combinations of shapes for such a capacitive touch sensor. They rather indicate the basic implementation of a capacitive touch sensor that provides the required redundant operation and is capable to perform a verification operation.

FIG. 11 with reference to any of FIG. 4 to FIG. 10 shows an example embodiment 210 of GPIO states used by the processor 90 to perform self-capacitance and mutual-capacitance measurements. In FIG. 11, Mode 1 provides a mode for proximity detection of a finger touch (e.g. body 126) to the overlay 122. Any state used by Mode 2A, Mode 2B, Mode 2C, (generally Mode 2), or Mode 3A and Mode 3B, (generally Mode 3), provide redundant methods for the mutual-capacitance measurement. Mode 1, Mode 2, or Mode 3 provide redundant methods of finger touch detection. Specifically, Mode 1 uses a self-capacitance measurement while Mode 2 and Mode 3 use a respective mutual capacitance measurement. Any state used by Mode 2 and Mode 3 provide redundant methods to verify the integrity of the touch pad sensors TP1 82, TP2 84 and TP3 86 as well any wiring or support circuitry directly connected thereto.

In the aforementioned embodiments of capacitive touch sensors, systems and methods, the requirement for mechanical switches is removed, thus providing cost and space savings, as well as improved reliability due to manufacturing tolerances, wear-out issues due to dirt, oxidation and aging. By using a single sensor based solely on capacitive touch sensing methods, a more cost-effective implementation is realized. Additionally, more additional safety knob designs (e.g., capacitive touch sensors) are possible. The mutual-capacitance measurements can detect numerous errors including but not limited to broken wires, shorted wires, unstable connections due to poor contacts, crosstalk between wires, shorting between electrodes, broken electrode pads, and shorting, opening and degradation issues. In some embodiments, a detection of an error in the Mode 2 or Mode 3 measurements is used to identify and subsequently disable the errant component, so that finger touch detection can continue in a degraded integrity mode. In a degraded integrity mode, measurements associated with a faulty sensor or wiring are either not performed or not considered when performing the finger touch detection. It is further possible to replace a measurement associated with a faulty element by a redundant method or measurement. When a singular failure is detected in either Mode 2 or Mode 3, the errant component is disabled and finger touch continues in the degraded integrity mode, but without impacting successful detection of a finger touch. Protypes have demonstrated a finger touch sensitivity of 300 Least Significant Bits (LSBs) using a 12-bit ADC, and greater than 3000 LSB sensitivity when detecting a broken wire to one of TP1 82, TP2 84 or TP3 86. If either method of finger touch detection fails, the touch sensor embodiment 80 continues to detect the finger touch in a "degraded" mode, such that a finger touch is detected without the safety mechanisms defined in the ISO20626 standard.

Figure 12:
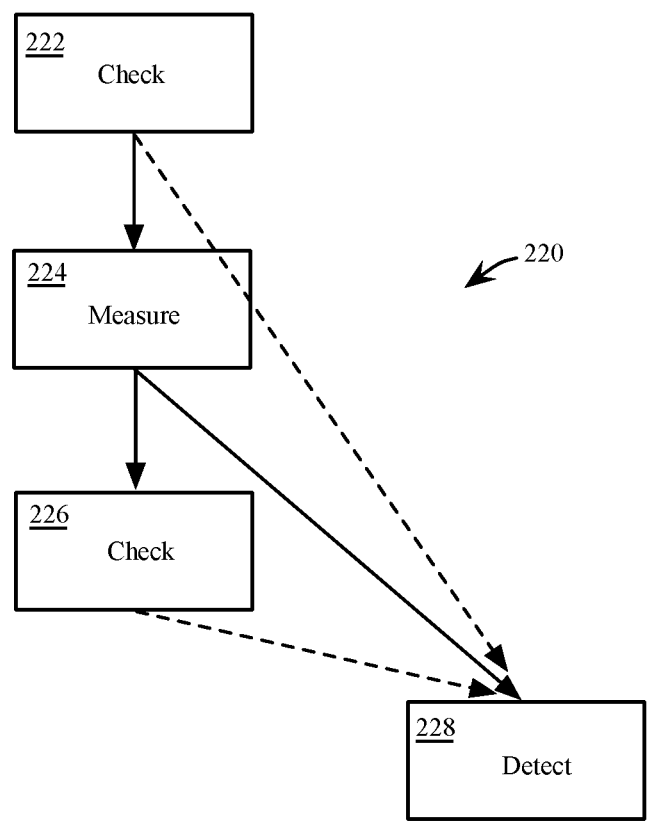
FIG. 12 is a flowchart representation of a method for capacitive touch sensing with high safety integrity, in accordance with an example embodiment of the present disclosure.

FIG. 12 with reference to FIG. 4, FIG. 5 and FIG. 6 shows a method 220 of capacitive touch sensing with high safety integrity. Specifically, the checks performed to verify the integrity of the electrodes 82, 84 and 86, the associated wiring thereto, and other related components of the embodiment 80 (e.g. the capacitor 100, the resistor 104 and the functionality of GPIO ports of the processor 90) are performed at different times in accordance with respective embodiments. In one embodiment, a first check 222 of integrity is performed prior to a measure 224 of a finger touch detection. In another embodiment, a second check 226 is performed after the measure 224, without the first check 222 being performed. In another embodiment, both the first check 222 and the second check 226 are performed. Following the checks 222 and/or check 226 and measure 224, a contact of the body 126 to the surface of the pad dielectric (e.g. overlay 122) is detected with a detect 228. A check 222 and/or 226 verifies the integrity of the relevant electrodes 82, 84, 86, the wiring thereto and related system components of embodiment 80 to ensure there are no integrity issues related to contamination, shorts, and the like. A measure 224, measures a value from Mode 1 and/or Mode 3 to subsequently determine (with detect 228) that a valid finger touch, or body 126 to the overlay 122 has occurred.

With reference to FIG. 11 and FIG. 12, a check 222 and/or 226 includes at least one of the combinations of the following: (i) Mode 2A and Mode 2B; (ii) Mode 2A and Mode 3; (iii) Mode 2B and Mode 3; and (iv) Mode 2C alone. To identify an erroneous element (or wiring thereto) it is sufficient to use any of the combinations (i), (ii) or (iii), or (iv) used in combination with one of Mode 2A, Mode 2B or Mode 3. In one embodiment, information gathered during the check 222 and/or check 226 is used to isolate and remove a faulty element from the subsequent detect 228 evaluation. For example, if TP3 86 is determined to be faulty, then a finger touch measurement using both Mode 1 and Mode 3, can rely solely on Mode 3 while excluding the measurement made with Mode 1.

Figure 13:
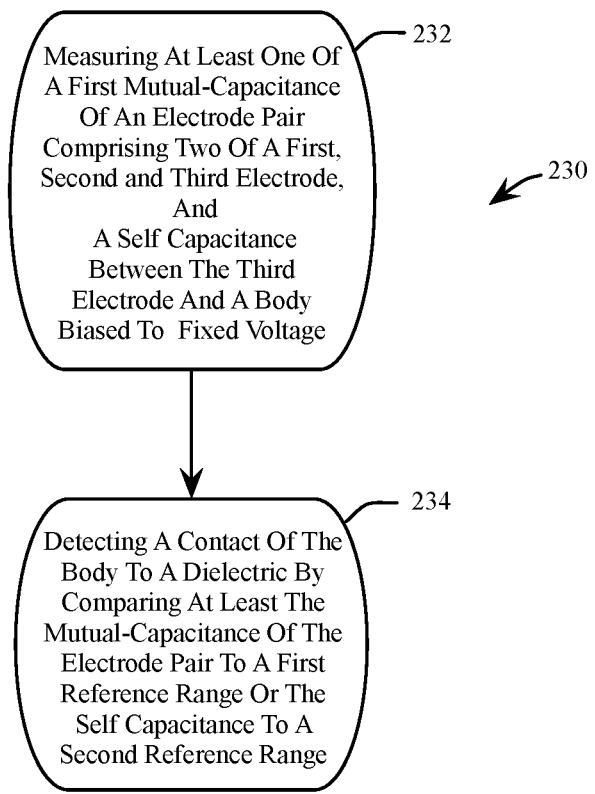
FIG. 13 is a flowchart representation of a method for capacitive touch sensing with high safety integrity, in accordance with an example embodiment of the present disclosure.

FIG. 13 with reference to FIG. 4, FIG. 5 and FIG. 6 shows a method 230 of capacitive touch sensing with high safety integrity. At 232, one of a first mutual-capacitance 116 is measured between an electrode pair comprising two of a first electrode 82, a second electrode 84 and a third electrode 86, and a self-capacitance between the third electrode 86 and a body 126 biased to a fixed voltage (e.g., a ground of a vehicle within which the body is a passenger). At 234, a contact of the body 126 to a dielectric 122 is detected by comparing at least the mutual-capacitance 116 of the electrode pair to a first reference range (stored in the processor 90) or to the self-capacitance to a second reference range (stored in the processor 90).

Figure 14:
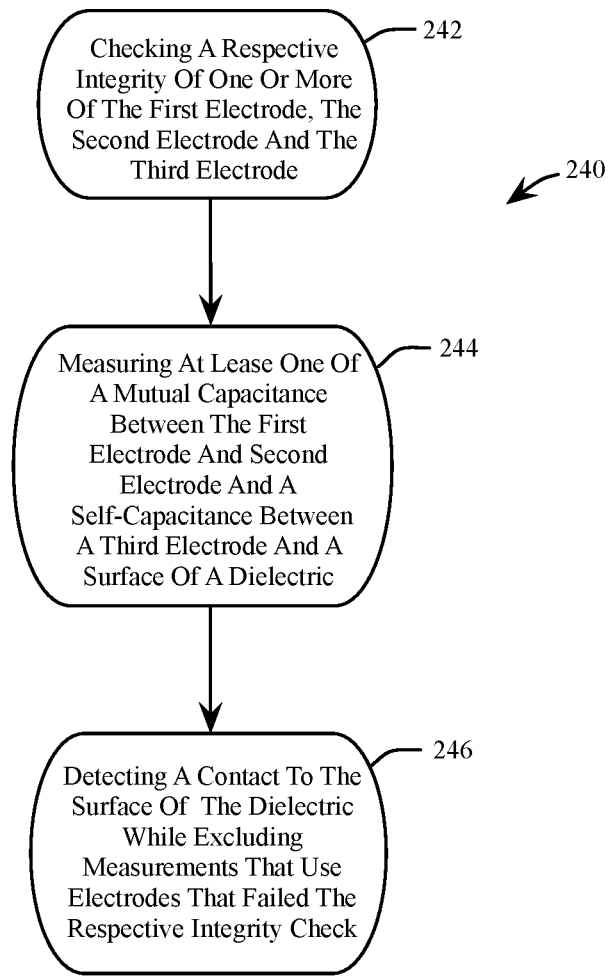
FIG. 14 is a flowchart representation of a method for capacitive touch sensing with high safety integrity, in accordance with an example embodiment of the present disclosure.

FIG. 14 with reference to FIG. 4, FIG. 5 and FIG. 6 shows a method 240 of capacitive touch sensing with high safety integrity. At 242, a first mutual-capacitance 116 is measured between two of a first electrode 82 a second electrode 84, and a third electrode 86. At 244, a self-capacitance is measured between a third electrode 86 and a surface of a dielectric 122. At 246, a contact to the surface of the dielectric 122 is detected by comparing at least the mutual-capacitance 116 of the first electrode 82 and the second electrode 84 to a first reference range (stored in the processor 90) or to the self-capacitance to a second reference range (stored in the processor 90).

As will be appreciated, embodiments as disclosed include at least the following. In one embodiment, a method for capacitive touch sensing with high safety integrity comprises measuring at least one of a first mutual-capacitance of an electrode pair comprising two of a first electrode, a second electrode and a third electrode, and a self-capacitance between the third electrode and a body biased to a fixed voltage. A contact of the body to a dielectric overlaying each of the first electrode, the second electrode and the third electrode is detected, by comparing at least one of the first mutual-capacitance of the electrode pair to a first reference range, and the self-capacitance to a second reference range.

Alternative embodiments of the method for capacitive touch sensing with high safety integrity include one of the following features, or any combination thereof. Measuring the first mutual capacitance determines a fault related to one or more of the first electrode, the second electrode and a respective wiring connected thereto. A second mutual-capacitance is measured between the first electrode and the third electrode, wherein the first electrode is proximal to the third electrode, to determine a fault related to one or more of the first electrode, the third electrode and a respective wiring connected thereto. A third mutual-capacitance is measured between the second electrode and the third electrode, wherein the second electrode is proximal to the third electrode to determine a fault related to one or more of the second electrode, the third electrode and a respective wiring connection thereto. The first mutual-capacitance is measured by applying a high slew rate pulse on the first electrode and measuring a received charge on the second electrode, wherein the first mutual-capacitance is altered by the body contacting the dielectric. The self-capacitance is measured by discharging the third electrode, charging a reference capacitor, shorting the third electrode to the reference capacitor while the body is contacting the dielectric and comparing a resulting voltage on the reference capacitor to a threshold value. The first reference range excludes a value of the mutual-capacitance of the electrode pair resulting from a low-resistance short of one of the first electrode and the second electrode to one of a power supply or a ground. The second reference range excludes a value of the self-capacitance resulting from a low-resistance short of the third electrode to one of a power supply or a ground. The contact of the body to the dielectric is detected with the self-capacitance measurement in a degraded integrity mode when a fault is detected in one of the first electrode, the second electrode and a respective wiring connected thereto. The contact of the body to the dielectric is detected with the mutual-capacitance measurement in a degraded integrity mode when a fault is detected in one of the third electrode and a respective wiring connected thereto.

In another embodiment, an apparatus comprises a first electrode vertically disposed between an electrically non-conductive base and an electrically non-conductive overlay. A second electrode is horizontally disposed proximal to the first electrode. A third electrode is horizontally disposed proximal to the first electrode and the second electrode, wherein each of the first electrode, the second electrode and the third electrode are electrically conductive. A processor is configured to measure a first mutual-capacitance of an electrode pair comprising the first electrode, the second electrode and a third electrode, measure a self-capacitance between the third electrode and a body biased to a fixed voltage, and detect a contact of the body to an electrically non-conductive overlay, by comparing at least one of the mutual-capacitance of the electrode pair to a first reference range, and the self-capacitance to a second reference range.

Alternative embodiments of the apparatus include one of the following features, or any combination thereof. The first electrode and the second electrode each comprise a triangular shape comprising a respective hypotenuse proximal to each other, and a third electrode comprising a rectilinear shape surrounding the first electrode and the second electrode. The first electrode and the second electrode each comprise a rectilinear shape having a respective edge proximal to each other, and a third electrode comprising a rectilinear shape surrounding the first electrode and the second electrode. The first electrode and the second electrode each comprise a rectilinear shape having a respective edge proximal to each other, and a third electrode comprising a rectilinear shape surrounded by the first electrode and the second electrode. The first electrode and the second electrode each comprise a semicircular shape having a respective edge proximal to each other, and a third electrode surrounds the first electrode and the second electrode. The first electrode and the second electrode each comprise a curved shape having a respective edge proximal to each other, and a third electrode comprising a spherical shape surrounded by the first electrode and the second electrode. The body is a finger of a human and the reference voltage is a ground potential of the environment.

In another embodiment, a method for capacitive touch sensing with high safety integrity comprises checking a respective integrity of one or more of a first electrode, a second electrode and a third electrode by measuring a first mutual-capacitance therewith. At least one of a second mutual-capacitance between a first electrode and a second electrode, the first electrode proximal to the second electrode, and a self-capacitance between a third electrode and a body decoupled from the third electrode through a dielectric overlaying the third electrode, is measured. A contact of the body to the dielectric based on the measurements using one or more of the first electrode, the second electrode and the third electrode is detected, each comprising a successful respective integrity check.

Alternative embodiments of the method for capacitive touch sensing with high safety integrity include one of the following features, or any combination thereof. The contact to the surface of the dielectric is detected with the self-capacitance measurement in a degraded integrity mode when a fault is detected with the checking of the respective integrity of one of the first electrode, the second electrode and a respective wiring connected thereto. The contact of the surface of the dielectric is detected with the mutual-capacitance measurement in a degraded integrity mode when a fault is detected with the checking of the respective integrity of one of the third electrode and a respective wiring connected thereto.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for capacitive touch sensing with high safety integrity comprising:
   measuring at least one of a first mutual-capacitance of an electrode pair comprising two of a first electrode, a second electrode and a third electrode, and a self-capacitance between the third electrode and a body biased to a fixed voltage; and
   detecting a contact of the body to a dielectric overlaying each of the first electrode, the second electrode and the third electrode, by comparing at least one of the first mutual-capacitance of the electrode pair to a first reference range, and the self-capacitance to a second reference range.

2. The method of claim 1 wherein measuring the first mutual capacitance determines a fault related to one or more of the first electrode, the second electrode and a respective wiring connected thereto.

3. The method of claim 1 further comprising measuring a second mutual-capacitance between the first electrode and the third electrode, wherein the first electrode is proximal to the third electrode, to determine a fault related to one or more of the first electrode, the third electrode and a respective wiring connected thereto.

4. The method of claim 1 further comprising measuring a third mutual-capacitance between the second electrode and the third electrode, wherein the second electrode is proximal to the third electrode, to determine a fault related to one or more of the second electrode, the third electrode and a respective wiring connection thereto.

5. The method of claim 1 wherein the first mutual-capacitance is measured by applying a high slew rate pulse on the first electrode and measuring a received charge on the second electrode, wherein the first mutual-capacitance is altered by the body contacting the dielectric.

6. The method of claim 1 wherein the self-capacitance is measured by discharging the third electrode, charging a reference capacitor, shorting the third electrode to the reference capacitor while the body is contacting the dielectric and comparing a resulting voltage on the reference capacitor to a threshold value.

7. The method of claim 1 wherein the first reference range excludes a value of the mutual-capacitance of the electrode pair resulting from a low-resistance short to one of a power supply or a ground.

8. The method of claim 1 wherein the second reference range excludes a value of the self-capacitance resulting from a low-resistance short of the third electrode to one of a power supply or a ground.

9. The method of claim 1 wherein the contact of the body to the dielectric is detected with the self-capacitance measurement in a degraded integrity mode when a fault is detected in one of the first electrode, the second electrode and a respective wiring connected thereto.

10. The method of claim 1 wherein the contact of the body to the dielectric is detected with the mutual-capacitance measurement in a degraded integrity mode when a fault is detected in one of the third electrode and a respective wiring connected thereto.

* * * * *